United States Patent [19]
Amelio et al.

[11] 4,448,804
[45] May 15, 1984

[54] METHOD FOR SELECTIVE ELECTROLESS PLATING OF COPPER ONTO A NON-CONDUCTIVE SUBSTRATE SURFACE

[75] Inventors: William J. Amelio, Binghamton; Gary K. Lemon; Voya Markovich, both of Endwell; Theodore Panasik, Vestal; Carlos J. Sambucetti, Croton-on-Hudson; Donna J. Trevitt, Vestal, all of N.Y.

[73] Assignee: International Business Machines Corporation, Armonk, N.Y.

[21] Appl. No.: 540,600

[22] Filed: Oct. 11, 1983

[51] Int. Cl.$^3$ .................. B05D 5/12; B05D 1/32; B05D 3/04; C23F 1/00
[52] U.S. Cl. .................................. 427/98; 156/630; 156/656; 156/666; 156/902; 427/282; 427/304; 427/307; 427/322; 430/313; 430/315
[58] Field of Search ............... 156/629, 630, 632, 634, 156/656, 666, 901, 902; 427/96–98, 140, 282, 301, 304, 307, 322; 29/829, 846, 852; 174/68.5; 430/313, 314, 315, 329

[56] References Cited
U.S. PATENT DOCUMENTS
3,846,168 11/1974 Elmore .................................. 427/98
3,978,252 8/1976 Lombardo et al. ............... 427/98 X Primary Examiner—William A. Powell
Attorney, Agent, or Firm—Mark Levy

[57] ABSTRACT

Multistep process for electroless plating of copper onto a non-conductive surface including the steps of: (1) laminating a rough copper sheet onto the non-conductive surface; (2) etching away all the copper; (3) conditioning the surface with multifunctional positively charged molecules derived from copolymers of polyacrylamide and functionally active tetraalkylammonium compounds in an diluted inorganic acid; (4) activating the conditioned surface preferably with stannous/palladium chloride particles; (5) treating the activated surface with deionized water and diluted HCl; (6) applying a photoresist layer to the surface and selectively exposing and developing the photoresist to produce a mask corresponding to the negative of the desired circuit pattern; and (7) plating copper using successively two baths differing in their oxygen and CN$^-$ concentration, where the foregoing steps are interspersed with washing steps.

20 Claims, No Drawings

METHOD FOR SELECTIVE ELECTROLESS PLATING OF COPPER ONTO A NON-CONDUCTIVE SUBSTRATE SURFACE

BACKGROUND OF THE INVENTION

The invention relates to a method for selectively metallizing surfaces of dielectric, non-conductive substrates, and more particularly for electrolessly plating the substrates with copper.

A process of selectively metallizing substrates is disclosed in U.S. Pat. No. Re. 28,042 to Rhodenizer et al.

U.S. Pat. Nos. Re. 28,042, 3,293,109 to Luce et al, 3,522,085 to Watanabe and 4,358,479 to Canestaro et al relate to methods of pre-conditioning a non-conductive surface of a plastic substrate by laminating a metal foil to the surface.

The etching of copper foils (e.g., with an acidic solution of $CuCl_2$) is disclosed in U.S. Pat. Nos. 2,908,557 to Black et al, 3,083,129 to Jones et al and 4,358,479.

In U.S. Pat. Nos. 3,563,784 to Innes et al, 3,573,937 to Drotar et al and 4,301,190 to Feldstein, methods of conditioning a non-conductive surface prior to activating are described.

In particular U.S. Pat. No. 3,421,922 to Wilson describes the application of a cationic film forming resin and in the method disclosed in co-pending application, Ser. No. 398,140 filed 7/14/82 to Bupp et al assigned to the assignee of the present application, an acidic solution containing multifunctional positively charged molecules consisting of copolymers of polyacrylamide forming the inert backbone and functionally active tetraalkylammonium compounds are applied prior to the activation.

The following U.S. patents relate to methods of cathodically activating a surface with solutions containing Pd and Sn salts: U.S. Pat. Nos. Re. 28,042; 4,008,343 to Cohen et al; 3,011,920 to Shipley, Jr.; and 3,562,038 to Shipley, Jr. et al. In the last two above-mentioned patents the steps of washing the activated surface with distilled water, then HCl and then again with distilled water are disclosed.

Copper plating baths for electrolessly metallizing activated non-conductive surfaces are described in U.S. Pat. Nos. 3,269,861 to Schneble, Jr. et al, 3,900,599 to Feldstein and 4,152,467 to Alpaugh et al.

The teaching of the prior art as cited above provides effective methods for electrolessly plating copper to non-conductive surfaces of dielectric materials, such as thermosetting to thermoplastic resins and glass. However, the indicated methods require a very high number of process steps. In addition, with the continuing trend to miniaturization, to denser packaging of components and to more complex circuits, it becomes more and more difficult to adhere to the process specifications in using the prior art methods. For these reasons the yield of good products and their reliability decrease. Also the known methods provide no effective way to save components in which defects are detected after electroless plating and into which a considerable amount of money and effort have been invested.

It is therefore an object of the invention to improve the known methods for selective electroless plating of copper to non-conductive surfaces.

It is another object of the invention to provide a simple method for selective electroless plating of copper to non-conductive surfaces.

It is a further object of the invention to provide a method for electrolessly plating reproducibly within small tolerances.

It is still another object of the invention to produce parts reliable in field use and requiring little maintenance.

It is still a further object of the invention to produce high quality copper-plated epoxy panels.

It is also an object of the invention to provide a method for reworking defective parts having already undergone the electroless plating process.

SUMMARY OF THE INVENTION

These objects are achieved by a method comprising the steps of:

(a) providing a copper sheet having a roughened surface;

(b) laminating the copper sheet to a dielectric substrate material by pressing the roughened surface of the copper sheet against the surface of the substrate;

(c) etching away all copper;

(d) conditioning the etched surface by bringing it into contact with the surface with an acidic solution containing a multi-functional cationic group containing at least two available cationic moieties;

(e) activating or seeding the conditioned surface by bringing it into contact with at least one solution containing stannous and/or palladium chloride;

(f) rinsing the activated surface with distilled water;

(g) bringing the rinsed, activated surface into contact with an aqueous solution of HCl;

(h) rinsing the HCl treated surface with deionized water;

(i) applying a photoresist layer to the cleaned, activated surface, and exposing and developing the photoresist;

(j) plating the activated or seeded surface by bringing it into contact for a period of from about 15 to about 30 minutes with a first plating bath containing $CuSO_4$, EDTA, HCHO, a surfactant and having an oxygen content of less than 2 ppm and then for a period from about 10 to about 20 hours with a second plating bath differing from the first plating bath by an increased oxygen content of about 3 ppm to about 4 ppm and a NaCN content of 10 ppm to 20 ppm.

The application of the inventive method results in a more homogeneous plating due to an increased adhesion of the seeding to the substrate surface. The adhesion of the seed particles to the substrate is so strong that the photoresist process following the seeding and accelerating step does not impact the seeding. With the inventive method also a very good adhesion of the plated metal is achieved. Compared with prior art methods, the inventive method is relatively simple, especially when the seeding is made in one step (single seeding). With the inventive method plating can be performed according to tight specifications.

Advantageously the inventive method is applied to substrates consisting of thermosetting or thermoplastic resins or of glass.

The inventive method is also advantageously applied for reworking substrates that have already undergone electroless plating and eventually a soldering step but have been rejected subsequently due to failures. Such failures may be too many nodules that can not be sanded, too many opens or plating voids, solder defects, scratches on the circuitry, misregistration of the copper lines, or failures due to lack of photoresist adhesion. The prerequisite for using the inventive method for rework is that the substrates are structurally sound. When using the inventive method for rework, the above indicated inventive method starts with step (c). As an additional advantage, the compounds used for conditioning the surface prior to seeding are not toxic to the plating bath.

DESCRIPTION OF THE PREFERRED EMBODIMENT

The invention will become more apparent from the following detailed description.

The inventive method is applicable to electroless plating copper onto a wide variety of non-conductive dielectric substrates including especially thermoplastic and thermosetting resins and glass.

Typical thermosetting polymeric materials include epoxy, phenolic base materials, and polyamides. The dielectric substrates may be molded of the polymers containing fillers and/or reinforcing agents such as glass filled epoxy or phenolic base materials. Suitable thermoplastic polymeric materials include polyolefins such as polypropylene, polysulfones, polycarbonates and nitrile rubbers.

A copper sheet having a roughened surface is laminated onto the surface of the dielectric substrate by pressing the roughened surface of the copper sheet against the surface. The copper foil has a thickness of about 25.4 $\mu$m. Subsequently the copper foil is completely etched off, preferably by using an aqueous solution free of complexing agents and containing $CuCl_2$ and HCl. An aqueous solution of persulfate can also be used as agent. Apparently at this stage of the process anchor points for the copper have developed at the surface to be plated. These anchor points facilitate the plating of the copper afterwards and improve its adhesion to the surface.

If through-connections are formed in the substrate, (e.g., if printed circuits on both sides of a flat substrate have to be connected), holes are now drilled through the substrate preferably by a laser beam. Subsequently the holes are cleaned by sand or vapor blasting and chemically such as by solvent swelling. It is also possible to produce the holes prior to removing the copper sheet.

Next is a cleaning step, where the substrate is preferably cleaned for about five minutes at a temperature of between 45° C. and 60° C. with a alkaline cleaner consisting of a solution containing sodium phosphate and sodium silicate and having a $p_H$ value of 13. The cleaner is rinsed off with deionized water having a temperature of between 45° C. and 60° C.

In the next step the substrate surface including the holes is treated with an acidic solution containing a multifunctional ionic copolymer containing at least two available cationic functional moities. The preferred ionic moities are quarternary phosphonium and quarternary ammonium groups. Copolymers containing at least two cationic moities, such as, for example, copolymers of polyacrylimide forming the inert backbone and functionally active tetraalkylammonium compounds, are commercially available and need not be described herein in detail. Multifunctional cationic copolymers of that type are Reten 210, and Reten 220, available from HERCULES, description of which can be found in "Water-Soluble Polymers", Bulletin VC-482A, HERCULES Inc., Wilmington, Del., 19899, disclosure of which in incorporated herein by reference.

Reten 210 is in powder form and is a copolymer of acrylamide and beta-methacryloxyethyltrimethylammonium methyl sulphate of which a 1%-solution has a Brookfield viscosity of 600-1000 cps. Reten 220 is also in powder form and consists of the same monomers as Reten 210 but its 1%-solution has a Brookfield viscosity of 800-1200 cps. The molecular weights of the Reten polymers are usually relatively high and vary from about 50,000 to about 1,000,000 or more. The quarternary ammonium groups provide the number of positive charges of the polymer.

In the preferred aspects of the present invention, the ionic copolymer is employed as a dilute acidic solution of about 0.01% to about 1% by weight and preferably about 0.05% to about 0.5% by weight of the copolymer. The acid contained in the solution is preferably $H_2SO_4$ and the $p_H$ value of the solution is between 0 and about 3. The use of a low $p_H$ value is preferred to obtain a relatively low viscosity of the copolymer solution to facilitate application of the polymer. The treatment with the ionic copolymer is generally about 1 minute to about 10 minutes and preferably about 1 minute to about 2 minutes and takes place at about room temperature.

The multifunctional copolymer, having a very good adhesion to the substrate surface, provides the surface with a charge opposite from that associated with the seed particles to be subsequently applied to the substrate. This difference in polarity provides for electrostatic attraction of the seed particles. After the substrate is brought into contact with the ionic copolymer composition, the substrate is rinsed to remove any access polymer not adhering to the substrate surface.

Next, the substrate surface is activated or seeded by contact with a composition containing palladium chloride, HCl and stannous chloride, capable of initiating the electroless plating process. The seeding is performed in a one-step process.

To produce the seeder bath two solutions (A and B) are prepared. About 60 kgrs of $SnCl_2.2\ H_2O$ are dissolved in 20 liters of concentrated (37%) HCl with stirring. It is very important to dissolve the $SnCl_2 .2\ H_2O$ in concentrated HCl. Under these conditions no hydrolysis of the Sn-salt takes place. When the salt is totally dissolved more 37% HCl is added until a volume of 50 liters is reached (solution A). About 1 kgr of $PdCl_2$ is dissolved in 15 liters of 37% HCl. This solution is diluted with deionized water until a volume of 50 liters is reached (solution B). Solution B is added slowly to solution A with stirring. The mixture is boiled for two hours. After cooling down about 70 grs of a fluorocarbon surfactant, such as FC-95 marketed under this tradename by Minnesota Mining and Manufacturing Co. and consisting of a perfluoro alkylsufonate, are added. This solution can be stored for several months. To prepare the actual seeder bath, about 130 ml of this solution and about 175 grs of NaCl are taken to a volume of one liter by adding deionized water. This seeder bath contains per liter solution about 80 grs of $SnCl_2.2\ H_2O$, about 1.2 grs $PdCl_2$, about 85 ml of 37% HCl, about 0.09 gr of FC-95 and NaCl. In order to replenish the seeder bath after it is used for some time, fresh solution can be added. It was found that the seeder bath works satisfactorily if the amount of $SnCl_2.H_2O$ varies between 80 and 150 grs, $PdCl_2$ varies between 1.2 grs and 2.6, and 37% HCl varies between 85 and 300 ml per liter of solution. It contains colloidal particles having a nucleus of palladium and tin in the weight ratio of 1:3 and a shell of chloride ions.

The surfaces are brought into contact with the colloidal solution at room temperature for five minutes. However, the contact time can vary between 1 minute and 10 minutes.

The colloidal particles, having a shell of negative chloride ions, adheres by means of electrostatic attraction to the dielectric surface having positive charges due to the conditioning with Reten.

In the next process step the substrates are rinsed with deionized water. Due to the sudden change of the $p_H$ value, most of the chloride ions are replaced by $OH^-$ ions. Subsequently the substrates are treated with 8% HCl, where tin is selectively removed from the substrate surface. This leaves enriched Pd regions with an increased catalytic effect in the plating process. After the HCl treatment, the amount of Sn has been reduced to less than 1 $\mu gr/cm^2$, whereas the amount of Pd is of the order of 3–4 $\mu grs/cm^2$.

After another rinse with deionized water the substrates are vacuum dried in a oven for 30 minutes at a temperature of about 100° C. In the drying operation all the water is driven off irreversibly from the colloidal particles, leaving a shell of oxygen in the form of insoluble tin oxide.

Onto the dried substrate surface a photoresist layer is applied, either by spin-coating or, preferably, by laminating a photoresist foil onto the substrate surface. Such a foil is marketed by DuPont under the type designation T-168. T-168 is a negative photoresist. By exposure through an appropriate mask exactly aligned to the substrate and subsequent developing, the negative of the desired circuit pattern is produced of the photoresist foil. In the areas where the photoresist has been removed in the development step the catalyzed regions of the substrate surface are exposed. The photoresist process has no detrimental effect on the catalyzed surfaces including the through-holes. Next copper is plated by electroless plating onto the exposed surface areas. The plating is done in two steps differing in the composition of the baths used and in the duration of the step.

Both baths contain in one liter of solution about 8 grams to about 10 grams copper sulphate, about 35 grams to about 55 grams ethylene diamine tetraacetic acid (EDTA), about 2 ml to about 3 ml formaldehyde and 0.02 gram to about 0.03 gram of a surfactant. The surfactant resists the wetting surface to be coated. A satisfactory surfactant is, for instance, an organic phosphate ester available under the trade designation Gafac RE-610. The preferred $p_H$ value of the electroless plating bath is between 11.6 and 11.8 measured at a temperature of 25° C. The bath used in the first plating step contains no cyanide and the oxygen content is kept below 2 ppm. No gas is bubbled through this bath. $CN^-$ and oxygen form soluble, complex ions with Pd.

The bath used in the second plating step contains about 10 ppm to about 20 ppm cyanide. Its oxygen content is about 3 ppm which is achieved by bubbling air through the bath. It is not necessary to remove the substrates from the first bath and put it in the second. It is also possible to transform the first bath into the second by adding sodium cyanide and bubbling air through the bath after the first plating period. The plating takes place at a temperature between 70° C. and 80° C. and preferably between 70° C. and 75° C. where the substrate is plated in the first step from about 15 minutes to about 30 minutes and in the second plating step about 10 hours to about 20 hours. The plated copper is between about 37.5 and 50 $\mu m$ thick.

With the inventive method a homogenous coverage of all the substrate surface areas exposed including the through-holes is achieved. The thickness of the plated copper is essentially homogeneous and its adhesion to the substrate is excellent. After the plating the photoresist is stripped, preferably with methylene chloride or a similar solvent, and the Pd in the areas plated with copper is removed by a treatment with a chlorite solution.

The inventive method is applicable especially for producing copper circuit on substrates such as thermosetting and thermoplastic resins and of glass. The method is especially useful for producing high quality copper plated epoxy boards and cards.

Another very important application of the inventive method is its usage for reworking substrates that have already undergone electroless plating and eventually soldering, but have then been rejected due to defects. Such defects may be opens or plating voids, solder defects and scratches on the circuitry. The prerequisite for this application is that the substrate is structurally sound. The substrates to be reworked are selectively covered with copper and sometimes also selectively covered with photoresist and/or tin. In the first step of reprocessing, the photoresist is stripped, preferably with methylene chloride or similar organic solvents, and subsequently the substrates are dried. Then the copper and, if present, the tin are removed by etching. Preferably a $CuCl_2$/HCl solution is used, since this agent etches copper and also tin. At this stage the surface of the substrates apparently exhibit the roughness that is produced in the method described above by laminating a copper sheet with a roughened surface to the substrate surface to be plated and subsequently etching off the copper sheet. From this point on, the reprocessing steps are as described above (i.e., rinsing with an alkaline solution, conditioning the surface with a Reten solution, seeding the surface with palladium/tin salts in a single seed process, rinsing with deionized water, accelerating by removing most of the tin with an 8% HCl solution, forming a photoresist mask corresponding to the negative of the desired circuit pattern and finally the selective electroless copper plating).

The following two examples serve to illustrate preferred embodiments of the inventive method and are not intended to limit the teachings as set forth herein.

EXAMPLE I

Onto a substrate consisting of an epoxy resin a 25.4 $\mu m$ thick copper sheet having a roughened surface is laminated by pressing. Into the etched substrate, through-holes for producing vias are laser bored or mechanically drilled and then cleaned by sand or vapor blasting. The substrate is treated with an alkaline cleaner consisting of a solution containing sodium phosphate and sodium silicate and having a $p_H$ value of about 13. The substrate is rinsed with deionized water at a temperature of about 50° C. for two minutes. Subsequently the substrate is immersed for two minutes in a 0.05% solution of Reten 210 in 2% $H_2SO_4$ having a $p_H$ value of 1. After another rinse in warm deionized water the substrate is immersed in a seeder bath containing per liter of solution about 1.2 grams of $PdCl_2$, about 80 grams of $SnCl_2.2 H_2O$, about 85 ml 37% HCl, about 0.09 gram of FC-95 and about 175 grams of NaCl with the rest being water. The solution is prepared as described above. The substrate is immersed in the seeding bath at room temperature for 3–5 minutes. Subsequently the substrate is rinsed in deionized water, treated with 8% HCl at room temperature for 10 minutes, rinsed with deionized water for 3 minutes at room temperature and then vacuum-dried for 30 minutes at 100° C.

Onto the dried substrate a layer of T-168 photoresist is laminated. An illumination mask, the masked area of which corresponds to the negative of the desired circuit pattern, is aligned with the substrate and then the substrate is irradiated through the mask. Next is developing with a trichloroethane-based developer, whereby the seeded areas of the substrate to be plated are exposed.

Next the exposed areas of the substrate are electrolessly copper plated. Then the substrate is first immersed for about 30 minutes in a bath having a temperature of 72°±2° C. and containing per liter of solution 8–10 grams of $CuSO_4$, 35–55 grams of EDTA, 0.1 gram of GAFAC wetting agent, 2–3 ml formaldehyde and less than 2 ppm of oxygen with the rest being water. The bath has a $p_H$ value of 11.7 (measured at 25° C.).

Then the substrate is immersed in a second bath that has the same composition as the first bath except that its oxygen content is 3 ppm and it contains 10–20 ppm cyanide. In this bath, also at a temperature of 72°±2° C., the substrate remains 15 hours. The thickness of the plated copper is about 50.8 μm. Finally the photoresist mask is stripped with methylene chloride. The visual impression of the plated copper is excellent. All the exposed areas of the substrate including the through-holes are covered by a continuous copper film, the thickness of which is essentially homogeneous. It also has very good adhesion.

EXAMPLE II

An epoxy substrate having undergone the selective electroless plating still being covered with the photoresist mask and having been rejected due to defects is immersed in methylene chloride and then dried. The copper on the substrate is subsequently removed with a copper chloride/HCl solution. The process steps are identical with the process steps in Example I starting with treating the substrate in an alkaline cleaner. The plated copper produced in this example has equally favorable properties as the one produced in Example I.

While the invention has been particularly shown and described with reference to the embodiment thereof, it will be understood by those skilled in the art that the foregoing and other changes in form and detail may be made therein without departing from the spirit and scope of the invention.

We claim:

1. Method for selectively depositing copper onto the surface of a non-conductive substrate comprising the steps of:
   (a) providing a copper sheet having a roughened surface;
   (b) laminating said copper sheet to the non-conductive substrate surface by pressing the roughened surface of said copper sheet against the surface of said substrate;
   (c) etching away all copper;
   (d) conditioning the etched surface by contacting the surface with an acidic solution containing a multifunctional cationic group containing at least two available ionic moities;
   (e) activating the conditioned surface with particles of palladium/stannous chloride;
   (f) rinsing the activated surface with deionized water;
   (g) bringing the rinsed, activated surface into contact with an aqueous solution of HCl;
   (h) rinsing the HCl treated surface with deionized water;
   (i) drying the substrate at a temperature between 60° C. and 100° C.;
   (j) applying a photoresist layer to the cleaned, activated surface and exposing and developing the photoresist; and
   (k) plating the activated surface by bringing it into contact for a period from about 15 minutes to about 30 minutes with a first plating bath containing copper sulphate, a complexing agent, formaldehyde, a surfactant and an oxygen content of less than 2 ppm and then for a period from about 10 hours to about 20 hours with a second plating bath differing from the first plating bath by an increased oxygen content of about 3 ppm to about 4 ppm and a NaCN content of 10 ppm to 20 ppm.

2. Method according to claim 1, wherein the substrate consists of a thermosetting or thermoplastic resin or of a glass.

3. Method according to claim 1, wherein prior to the conditioning of the surface, holes are drilled into the substrate.

4. Method according to claim 2, wherein prior to the conditioning of the surface, holes are drilled into the substrate.

5. Method according to claim 1, wherein the conditioned surface is activated with a colloidal solution prepared from a mixture formed by mixing a solution of $SnCl_2.2\ H_2O$ in 37% HCl and a solution of $PdCl_2$ in diluted HCl, boiling for two hours and adding a surfactant and containing per liter of solution about 600 grs of $SnCl_2.2\ H_2O$, about 10 grs of $PdCl_2$, about 650 ml of 37% HCl and 0.7 gr of a surfactant, by diluting fixed amounts of said mixture with deionized water, the colloidal solution containing per liter 1.2 grams to 2.25 grams of $PdCl_2$, 80 grams to 150 grams of $SnCl_2.2\ H_2O$, 80 ml to 160 ml of 37% HCl and 0.09 gram to 0.16 gram of the surfactant.

6. Method according to claim 2, wherein the conditioned surface is activated with a colloidal solution prepared from a mixture formed by mixing a solution of $SnCl_2.2\ H_2O$ in 37% HCl and a solution of $PdCl_2$ in diluted HCl, boiling for two hours and adding a surfactant and containing per liter of solution about 600 grs of $SnCl_2.2\ H_2O$, about 10 grs of $PdCl_2$, about 650 ml of 37% HCl and 0.7 gr of a surfactant, by diluting fixed amounts of said mixture with deionized water, the colloidal solution containing per liter 1.2 grams to 2.25 grams of $PdCl_2$, 80 grams to 150 grams of $SnCl_2.2\ H_2O$, 80 ml to 160 ml of 37% HCl and 0.09 gram to 0.16 gram of the surfactant.

7. Method according to claim 3, wherein the conditioned surface is activated with a colloidal solution prepared from a mixture formed by a mixing solution of $SnCl_2.2\ H_2O$ in 37% HCl and a solution of $PdCl_2$ in diluted HCl, boiling for two hours and adding a surfactant and containing per liter of solution about 600 grs of $SnCl_2.2\ H_2O$, about 10 grs of $PdCl_2$, about 650 ml of 37% HCl and 0.7 gr of a surfactant, by diluting fixed amounts of said mixture with deionized water, the colloidal solution containing per liter 1.2 grams to 2.25 grams of $PdCl_2$, 80 grams to 150 grams of $SnCl_2.2\ H_2O$, 80 ml to 160 ml of 37% HCl, and 0.09 gram to 0.16 gram of the surfactant.

8. Method according to claim 4, wherein the conditioned surface is activated with a colloidal solution prepared from a mixture formed by a mixing solution of $SnCl_2.2\ H_2O$ in 37% HCl and a solution of $PdCl_2$ in diluted HCl, boiling for two hours and adding a surfactant and containing per liter of solution about 600 grs of $SnCl_2.2\ H_2O$, about 10 grs of $PdCl_2$, about 650 ml of 37% HCl and 0.7 gr of a surfactant, by diluting fixed amounts of said mixture with deionized water, the colloidal solution containing per liter 1.2 grams to 2.25 grams of $PdCl_2$, 80 grams to 150 grams of $SnCl_2.2\ H_2O$, 80 ml to 160 ml of 37% HCl, and 0.09 gram to 0.16 gram of the surfactant.

9. Method for selectively depositing copper onto the surface of a dielectric substrate comprising the steps of:
(a) providing a copper sheet having a roughened surface;
(b) laminating said copper sheet to the dielectric substrate surface by pressing the roughened surface of said copper sheet against the surface of said substrate;
(c) etching away all copper by bringing the resulting laminated article into contact with an aqueous solution free of complexing agents and containing persulphate or $CuCl_2$ and HCl;
(d) conditioning the etched surface by bringing the surface into contact with an acidic solution containing multifunctional positively charged molecules consisting of copolymers of polyacrylamide forming the inert backbone and functionally active tetraalkylammonium compounds;
(e) activating the conditioned surface by bringing the surface into contact with a solution containing about 1.2 grams of $PdCl_2$, about 80 grams of $SnCl_2.2\ H_2O$, about 85 ml of 37% HCl and about 0.1 gram of a surfactant;
(f) rinsing the activated surface with deionized water;
(g) bringing the rinsed, activated surface into contact with an aqueous 8% solution of HCl;
(h) rinsing the HCl treated surface with deionized water;
(i) vacuum-drying the substrate at about 100° C. for 30 minutes;
(j) laminating a photoresist layer to the cleaned, activated surface and exposing selectively and developing the photoresist;
(k) plating the activated surface by bringing the surface into contact for about 30 minutes with a plating bath containing:

| | |
|---|---|
| dissolved $O_2$ | 1.0–1.5 ppm |
| copper sulphate | 8–10 grams/liter |
| EDTA | 35–55 grams/liter |
| HCHO | 2–3 ml/liter |
| surfactant | .15%; and |

(l) bringing the resulting copper plated substrate into contact for about 15 hours with a plating bath containing:

| | |
|---|---|
| dissolved $O_2$ | 3 ppm |
| copper sulphate | 8–10 grams/liter |
| EDTA | 35–55 grams/liter |
| NaCN | 15–20 ppm |
| HCHO | 2–3 ml/liter |
| surfactant | .15%. |

10. Method according to claim 9, wherein the substrate consists of a thermosetting or thermoplastic resin or of a glass.

11. Method according to claim 9, wherein the acidic solution of the copolymer is about 0.5% and has a $p_H$ value of between about 0 and about 3.

12. Method according to claim 10, wherein the acidic solution of the copolymer is about 0.5% and has a $p_H$ value of between about 0 and about 3.

13. Method for selectively depositing copper onto a surface of a non-conductive dielectric substrate which has been electrolessly copper plated and subsequently rejected due to failures comprising the steps of:
(a) stripping any masking materials and etching off all the copper from the dielectric substrate;
(b) conditioning the etched surface by bringing the surface into contact with an acidic solution containing a multifunctional cationic group containing at least two available cationic moities;
(c) activating the conditioned surface by bringing the surface into contact with stannous/palladium chloride particles;
(d) rinsing the activated surface with deionized water;
(e) bringing the rinsed, activated surface into contact with an aqueous solution of HCl;
(f) rinsing the HCl treated surface with deionized water;
(g) drying the substrate at a temperature between 60° C. and 100° C.;
(h) applying a photoresist layer to the cleaned activated surface, and exposing and developing the photoresist; and
(i) plating the activated surface by bringing the surface into contact for a period of from about 15 minutes to about 30 minutes with a first plating bath containing copper sulphate, a complexing agent, HCHO, a surfactant and less than 2 ppm oxygen and then for a period of from about 10 hours to about 20 hours with a second plating bath differing from the first plating bath by an increased oxygen content of about 3 ppm to about 4 ppm and a NaCN content of 10 ppm to 20 ppm.

14. Method according to claim 13, wherein the substrate consists of a thermosetting or thermoplastic resin or of a glass.

15. Method according to claim 13, wherein the conditioned surface is activated with a colloidal solution prepared from a mixture formed by mixing a solution of $SnCl_2.2\ H_2O$ in 37% HCl and a solution of $PdCl_2$ in diluted HCl, boiling for two hours and adding a surfactant and containing per liter of solution about 600 grs of $SnCl_2.2\ H_2O$, about 10 grs of $PdCl_2$, about 650 ml of 37% HCl and 0.7 gr of a surfactant, by diluting fixed amounts of said mixture with deionized water, the colloidal solution containing per liter 1.2 grams to 2.25 grams of $PdCl_2$, 80 grams to 150 grams of $SnCl_2.2\ H_2O$, 80 ml to 160 ml of 37% HCl and 0.09 gram to 0.16 gram of the surfactant.

16. Method according to claim 14, wherein the conditioned surface is activated with a colloidal solution prepared from a mixture formed by mixing a solution of $SnCl_2.2\ H_2O$ in 37% HCl and a solution of $PdCl_2$ in diluted HCl, boiling for two hours and adding a surfactant and containing per liter of solution about 600 grs of $SnCl_2.2\ H_2O$, about 10 grs of $PdCl_2$, about 650 ml of 37% HCl and 0.7 gr of a surfactant, by diluting fixed amounts of said mixture with deionized water, the colloidal solution containing per liter 1.2 grams to 2.25 grams of $PdCl_2$, 80 grams to 150 grams of $SnCl_2.2\ H_2O$, 80 ml to 160 ml of 37% HCl and 0.09 gram to 0.16 gram of the surfactant.

17. Method for selectively depositing copper onto the surface of a non-conductive dielectric substrate which has been electrolessly copper plated and subsequently rejected due to failures comprising the steps of:
  (a) stripping any masking materials and etching off all the copper from the dielectric substrate;
  (b) conditioning the etched surface by bringing the surface into contact with an acidic solution containing multifunctional positively charged molecules derived from copolymers of polyacrylamide forming the inert backbone and functionally active tetraalkylammonium compounds;
  (c) activating the conditioned surface by bringing the surface into contact with a colloidal solution prepared from a mixture formed by mixing a solution of $SnCl_2.2\ H_2O$ in 37% HCl and a solution of $PdCl_2$ in diluted HCl, boiling for two hours and adding a surfactant and containing per liter of solution about 600 grs of $SnCl_2.2\ H_2O$, about 10 grs of $PdCl_2$, about 650 ml of 37% HCl and 0.7 gr of a surfactant, by diluting fixed amounts of said mixture with deionized water, the colloidal solution containing per liter 1.2 grams to 2.25 grams of $PdCl_2$, 80 grams to 150 grams of $SnCl_2.2\ H_2O$, 85 ml to 160 ml of HCl and 0.09 gr to 0.16 gr of the surfactant;
  (d) rinsing the activated surface with deionized water;
  (e) bringing the rinsed, activated surface into contact with an aqueous 8% solution of HCl;
  (f) rinsing the HCl treated surface with deionized water;
  (g) vacuum-drying the substrate at about 100° C. for about 30 minutes;
  (h) laminating a photoresist layer to the cleaned, activated surface, and selectively exposing and developing the photoresist;
  (i) plating the activated surface by bringing the surface into contact for about 30 minutes with a plating bath containing:

| | |
|---|---|
| dissolved $O_2$ | 1.0–1.5 ppm |
| copper sulphate | 8–10 grams/liter |
| EDTA | 35–55 grams/liter |
| HCHO | 2–3 ml/liter |
| surfactant | .15%; and |

(j) bringing the resulting copper plated substrate into contact for about 15 hours with a plating bath containing:

| | |
|---|---|
| dissolved $O_2$ | 3.5 ppm |
| copper sulfate | 8–10 grams/liter |
| EDTA | 35–55 grams/liter |
| NaCN | 15–20 ppm |
| HCHO | 2–3 ml/liter |
| surfactant | .15%. |

18. Method according to claim 17, wherein the substrate consists of a thermosetting or thermoplastic resin or of a glass.

19. Method according to claim 18, wherein the acidic solution of the copolymer is about 0.5% and has a $p_H$ value of between about 0 and about 3.

20. Method according to claim 18, wherein the acidic solution of the copolymer is about 0.5% and has a $p_H$ value of between about 0 and about 3.

* * * * *